(12) United States Patent
Yang et al.

(10) Patent No.: US 8,029,949 B2
(45) Date of Patent: Oct. 4, 2011

(54) PHOTOMASK FOR FORMING CONTACT HOLE IN SEMICONDUCTOR DEVICE

(75) Inventors: Hyun Jo Yang, Cheongju-si (KR); Dong Sook Chang, Pyeongtaek-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/637,038

(22) Filed: Dec. 14, 2009

(65) Prior Publication Data
US 2010/0316940 A1  Dec. 16, 2010

(30) Foreign Application Priority Data
Jun. 15, 2009  (KR) .................. 10-2009-0053066

(51) Int. Cl.
*G03F 1/00* (2006.01)
(52) U.S. Cl. .......................................... 430/5
(58) Field of Classification Search .................. 430/5
See application file for complete search history.

(56) References Cited

U.S. PATENT DOCUMENTS
2003/0027366 A1*  2/2003  Dulman et al. ............... 430/5

FOREIGN PATENT DOCUMENTS
| KR | 10-2006-0099607 | 9/2006 |
| KR | 10-2007-0110750 | 11/2007 |
| KR | 10-2008-0029493 | 4/2008 |
| KR | 10-2009-0076138 | 7/2009 |

OTHER PUBLICATIONS

KPION machine translation of Park (KR 10-2009-0076138 published Jul. 13, 2009 and filed Jan. 1, 2008).*

* cited by examiner

*Primary Examiner* — Mark F Huff
*Assistant Examiner* — John Ruggles
(74) *Attorney, Agent, or Firm* — Marshall, Gerstein & Borun LLP

(57) ABSTRACT

Disclosed is a photomask for forming a contact hole arranged on a wafer in a zigzag form along a transverse direction, including: a light transmitting substrate; a main pattern disposed on the light transmitting substrate with a zigzag form as an upper main pattern disposed in a relatively upper portion and a lower main pattern disposed in a relatively lower portion are arranged alternately along a transverse direction; a first lower auxiliary pattern extending in a vertical direction and disposed adjacently to a lower portion of the upper main pattern; a first upper auxiliary pattern extending in a vertical direction and disposed adjacently to an upper portion of the lower main pattern; a second lower auxiliary pattern extending in the transverse direction and connecting the first lower auxiliary patterns with each other; and a second upper auxiliary pattern extending in the transverse direction and connecting the first upper auxiliary patterns with each other.

7 Claims, 4 Drawing Sheets

PHOTOMASK FOR FORMING CONTACT HOLE IN SEMICONDUCTOR DEVICE

CROSS-REFERENCE TO RELATED APPLICATIONS

The present application claims priority to Korean patent application number 10-2009-0053066, filed on Jun. 15, 2009, which is incorporated by reference in its entirety.

BACKGROUND OF THE INVENTION

The invention relates generally to a photomask, and more particularly, to a photomask for forming a contact hole in a semiconductor device.

In general, a semiconductor device has a contact structure for receiving external electrical signals. To form this contact structure, a contact hole should be formed first. The contact hole can be formed in various forms according to a kind of a semiconductor device, and in one example, can have a form in which a plurality of the contact holes is repeatedly arranged in one direction with a spacing therebetween. To form the contact hole, a photoresist layer is formed first on a target layer to be formed with the contact hole, e.g., an insulation layer. After that, a photoresist layer pattern having an opening is formed through an exposure process and a development process. Through this opening, some region of the target layer, i.e., a region in a place to be formed with the contact hole is exposed. After that, the exposed portion of the target layer is removed using this photoresist layer pattern as an etch mask to thereby form the contact hole. In this procedure, the opening provided in the photoresist layer pattern is the result of a transfer of the pattern on the photomask onto the photoresist layer through the exposure process. Accordingly, position and size of the contact hole is dependent on the pattern formed on the photomask.

FIG. 1 is a plan view illustrating an example of a prior art photomask for forming a contact hole in a semiconductor device. Also, FIG. 2 is a plan view illustrating a contact hole pattern formed using the prior art photomask of FIG. 1. Referring to FIG. 1, a prior art photomask 100 has a structure in that a light shielding layer 110 such as a chromium (Cr) layer is disposed on a light transmitting substrate not shown). The light shielding layer pattern 110 exposes some portion of a surface of the light transmitting substrate and this exposed portion is a transfer pattern 120 corresponding to the contact hole to be formed. This transfer pattern 120 is disposed in plural along a transverse direction with a predetermined spacing. Referring to FIG. 2, as the result of implementing exposure and development on the photoresist layer using the photomask the photoresist layer 210 remains in a region corresponding to the light shielding layer pattern 110, and a prior art contact hole pattern 220 is formed in a region corresponding to the transfer pattern 120. However, as the degree of integration of semiconductor device has increased, a size of the contact hole to be formed and a gap between the contact holes become smaller and smaller. Therefore, there is often generated a bridge in that the formed prior at contact hole pattern 220 is connected with an adjacent prior art contact hole pattern 220. Accordingly the prior art contact hole patterns have recently been arranged in a zigzag form to restrict the generation of the bridge.

FIG. 3 is a plan view illustrating an example of a prior art photomask in zigzag form for forming a contact hole. Also, FIG. 4 is a plan view illustrating a prior art contact hole pattern formed using the prior art photomask of FIG. 3. Referring to FIG. 3, in the prior art photomask 300, the light shielding layer pattern 310 is disposed on the light transmitting substrate (not shown) to define the transfer pattern 320 corresponding to the contact hole to be formed. This transfer pattern 320 is a region in which the light transmitting substrate is exposed, and is arranged in a zigzag form. Referring to FIG. 4, as the result of implementing exposure and development on the photoresist layer using the prior art photomask 300, the photoresist layer 410 remains in a region corresponding to the light shielding layer pattern 310, and a prior art contact hole pattern 420 having a zigzag form like the transfer pattern 320 is formed in a region corresponding to the transfer pattern 320.

However, when forming the prior art contact hole pattern 420 in a zigag form the possibility of bridge generation is lowered but it is difficult to adjust depth of focus (DOF) upon the exposure. Accordingly, recently attempts have tried enhancing the depth of focus by inserting an auxiliary pattern (not shown) in the transfer pattern 320 of the prior art photomask 300. However, it is still difficult to maintain the spacing a (a FIG. 4) between the adjacent prior art contact hole patterns 420 to a predetermined spacing, and there occurs a problem that a length (b of FIG. 4) from the lowermost to the uppermost of the prior art contact hole tterns 429 exceeds a limit length defined upon design.

SUMMARY OF THE INVENTION

Embodiments of the invention are directed to a photomask for forming a contact hole in a semiconductor device, in which a contact hole in a zigzag form is spaced apart from an adjacent contact hole with over a predetermined spacing and a length from the lowermost to the uppermost of the contact hole patterns does not exceed a limit length defined upon design.

In one embodiment, a photomask for forming a contact hole arranged on a wafer in a zigzag form along a transverse direction, includes: a light transmitting substrate; a main pattern disposed on the light transmitting substrate with a zigzag form as an upper main pattern disposed in a relatively upper portion and a lower main pattern disposed in a relatively lower portion are arranged alternately along a transverse direction; a first lower auxiliary pattern extending in a vertical direction and disposed adjacently to a lower portion of the upper main pattern; a first upper auxiliary pattern extending in a vertical direction and disposed adjacently to an upper portion of the lower main pattern; a second lower auxiliary pattern extending in the transverse direction and connecting the first lower auxiliary patterns with each other; and a second upper auxiliary pattern extending in the transverse direction and connecting the first upper auxiliary patterns with each other.

Preferably, the photomask further includes: a light shielding layer pattern formed on a region of the light transmitting substrate on which the main pattern, the first lower auxiliary pattern, the first upper auxiliary pattern, the second lower auxiliary pattern and the second upper auxiliary pattern are not disposed.

Preferably, the photomask further includes: a phase shift layer pattern formed on a region of the light transmitting substrate on which the main pattern, the first lower auxiliary pattern, the first upper auxiliary pattern, the second lower auxiliary pattern and the second upper auxiliary pattern are not disposed.

Preferably, a critical dimension of the first lower auxiliary pattern and the first upper auxiliary pattern is smaller than a critical dimension of the main pattern.

Preferably, the second lower auxiliary pattern is connected to an end of the first lower auxiliary pattern which is opposite to an end adjacent to the upper main pattern, and the second upper auxiliary pattern is connected to an end of the first upper auxiliary pattern which is opposite to an end adjacent to the lower main pattern.

Preferably, the photomask further includes: a third auxiliary pattern arranged parallel to the second lower auxiliary pattern.

Preferably, the photomask further includes: a fourth auxiliary pa arranged parallel to the second upper auxiliary pattern.

In accordance with the invention, since the auxiliary patterns are arranged in a direction perpendicular to and parallel to a direction along which the main pattern in a zigzag form corresponding to a contact hole is arranged, it is possible to enhance a depth of focus upon exposure and, at the same time, enhance a contrast along a direction perpendicular to the direction along which the main pattern is arranged. Accordingly, it is possible to form a fine contact hole in a zigzag form capable of preventing bridging as well as setting a length from the uppermost to the lowermost within a limit range.

DESCRIPTION OF SPECIFIC EMBODIMENTS

Hereinafter, a photomask for forming a contact hole in a semiconductor device in accordance with the invention is described in detail with reference to the accompanying drawings.

Figure 1:
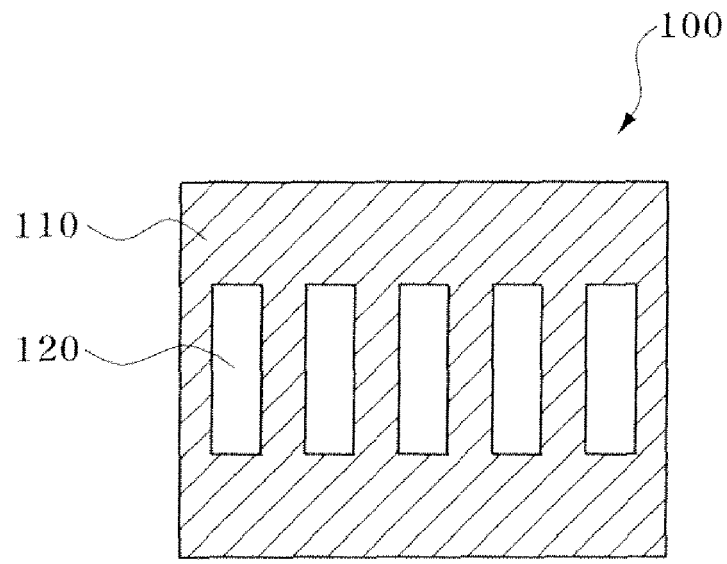
FIG. 1 is a plan view illustrating an example of a prior art photomask for forming a contact hole in a semiconductor device.
Figure 2:
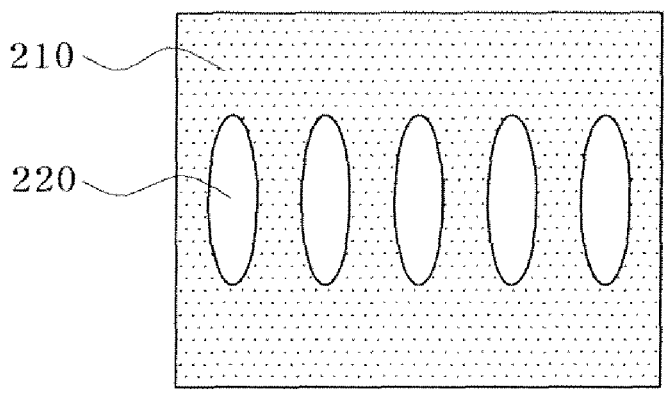
FIG. 2 is a plan view illustrating a prior art contact hole pattern formed using the prior art photomask of FIG. 1.
Figure 3:
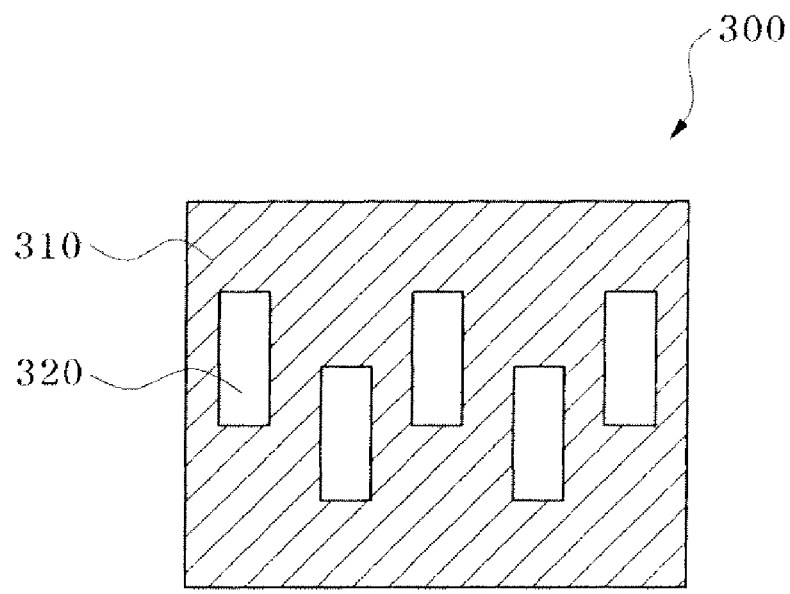
FIG. 3 is a plan view illustrating an example of a prior art photomask in a zigzag form for forming a contact hole.
Figure 4:
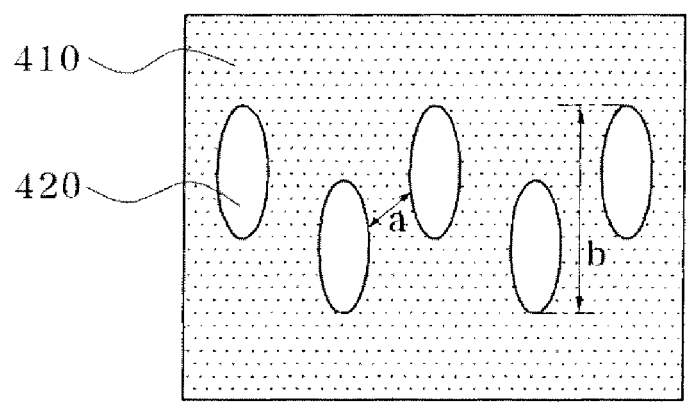
FIG. 4 is a plan view illustrating a prior art contact hole pattern formed using the prior art photomask of FIG. 3.
Figure 5:
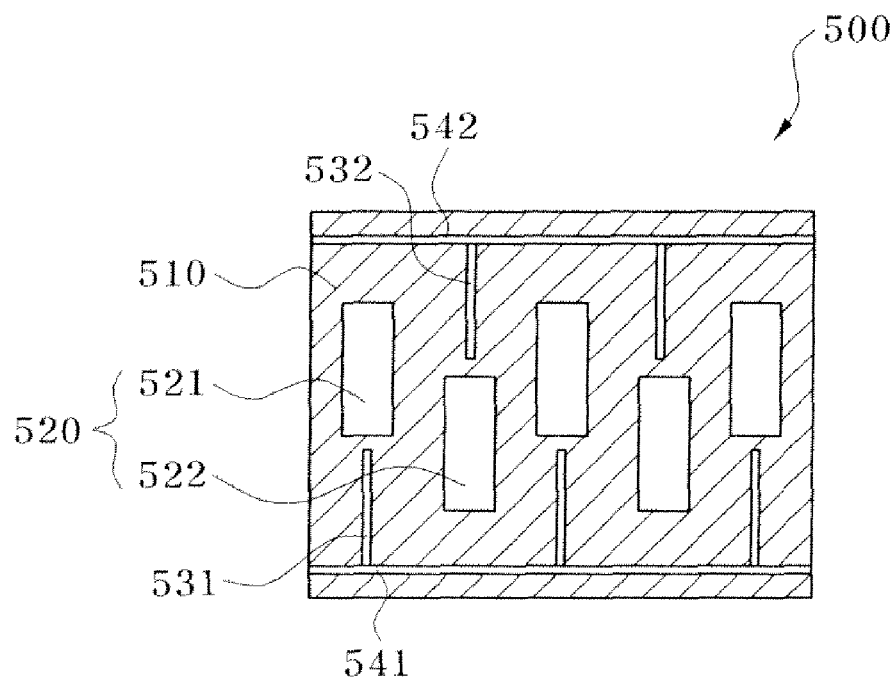
FIG. 5 is a plan view illustrating a photomask for forming a contact hole in a semiconductor device in accordance with an embodiment of the present invention.
Figure 6:
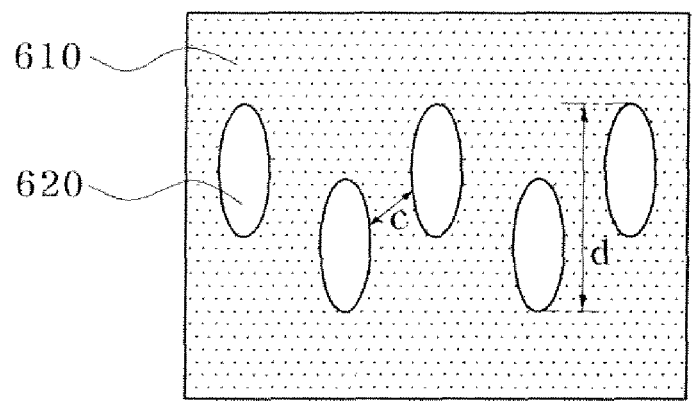
FIG. 6 is a plan view illustrating a contact hole pattern formed using the photomask of FIG. 5.

FIG. 5 is a plan view illustrating a photomask for forming a contact hole in a semiconductor device in accordance with some embodiments of the invention. Also, FIG. 6 is a plan view illustrating a contact hole pattern formed using the photomask of FIG. 5. Referring to FIG. 5, a photomask in accordance with some embodiments of the invention has a structure in that a light shielding layer pattern 510 for defining a main pattern 520 and an auxiliary pattern 531, 532, 541, 524 are arranged on a light transmitting substrate (not shown). The light transmitting substrate is made of a quartz material. Alternatively, the light transmitting substrate can be made of another transparent material having a required light transmittance. The light shielding layer pattern 510 is made of a chromium (Cr) layer. If necessary, a phase shift layer pattern can be disposed instead of the light shielding layer pattern 510.

The main pattern 520 includes an upper main pattern 521 disposed in a relatively upper portion and a lower main pattern 522 disposed in a relatively lower portion. The upper main pattern 521 and the lower main pattern 522 are disposed alternately along a transverse direction and the main pattern 520 has thus a zigzag form. This main pattern 520 is a portion in which the light transmitting substrate is exposed by the light shielding layer pattern 510, and a region of the photoresist layer corresponding to this main pattern 520 is thus exposed upon exposure.

The auxiliary pattern 531, 532, 541, 542 includes a first auxiliary pattern 531, 532 extending in a vertical direction perpendicular to a direction, along which the main pattern 520 is arranged, i.e., a transverse direction and a second auxiliary pattern 541, 542 extending in the transverse direction, along which the main pattern 520 is arranged. The first auxiliary pattern 531, 532 includes a first lower auxiliary pattern 531 disposed adjacently to a lower portion of the upper main pattern 521 and a first upper auxiliary pattern 532 disposed adjacently to an upper portion of the lower main pattern 522. A critical dimension of the first lower auxiliary pattern 531 and the first upper auxiliary pattern 532 is lower than a critical dimension of the upper main pattern 521 and the lower main pattern 522. The second auxiliary pattern 541, 542 includes a second lower auxiliary pattern 541 which connects the first lower auxiliary patterns 531 with each other and a second upper auxiliary pattern 542 which connects the first upper auxiliary patterns 533 with each other. The second lower auxiliary pattern 541 is connected to an end of the first lower auxiliary pattern 531 which is opposite to an end adjacent to the upper main pattern 521, and the second upper auxiliary pattern 542 is connected to an end of the first upper auxiliary pattern 532 which is opposite to an end adjacent to the lower main pattern 522. The first lower auxiliary pattern 531 and the first upper auxiliary pattern 532 aids to enhance a depth of focus upon the exposure, and the second lower auxiliary pattern 541 and the second upper auxiliary pattern 542 aids to enhance a contrast in a vertical direction.

Referring to FIG. 6, as the result of implementing exposure and development on the photoresist layer on a wafer using the photomask 500 in accordance with some embodiments of the invention, the photoresist layer 610 remains in a region corresponding to the light shielding layer pattern 510 and a region corresponding to the auxiliary pattern 531, 532, 541, 542, and a contact hole 620 in a zigzag form is formed in a region corresponding to the main pattern 520. The exposure can be implemented using an off-axis illumination system, and in this case, a dipole illumination system having apertures opposing to each other about a direction along which the main pattern 520 is arranged, i.e., a transverse direction. Upon the exposure using these dipole illumination system and photomask 500, it is possible to sufficiently ensure a spacing (c of FIG. 6) between the adjacent contact hole patters 620 and make a length from the upmost to the lowermost of the contact hole patterns 620 not being out of the limit range by the first auxiliary pattern 531, 532 aiding to enhance a depth of focus upon the exposure and the second auxiliary pattern 541, 542 aiding to enhance a contrast in a vertical direction.

Figure 7:
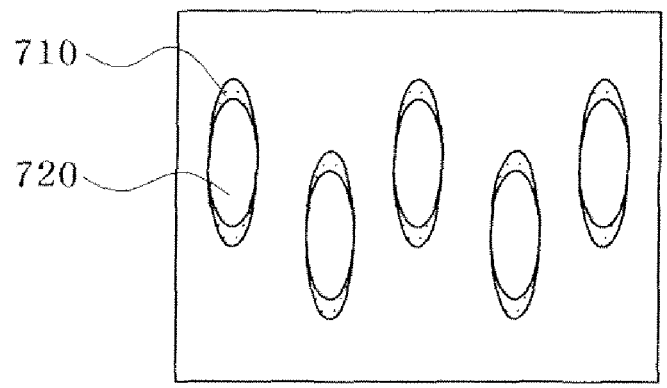
FIG. 7 is a plan view illustrating a comparison of a contact hole formed using a photomask in accordance with an embodiment of the present invention with a contact hole formed using a conventional photomask.

FIG. 7 is a plan view illustrating a comparison of the contact hole formed using the photomask in accordance with some embodiments of the invention with a contact hole formed using a conventional photomask. Specifically, a contact hole indicated by a reference numeral 710 in FIG. 7 is the contact hole formed by a conventional photomask in which an auxiliary pattern is placed in an upper or lower portion of a main pattern, and a contact hole indicated by a reference numeral 720 is the contact hole formed by a photomask in accordance with an embodiment of the present invention, which has the first auxiliary pattern 531, 532 and the second auxiliary pattern 541, 542. As illustrated in the figure, the contact hole 710 formed by the conventional photomask is longer in a vertical direction and this is mainly because of a low contrast in a vertical direction. On the contrary, the contact hole 720 formed using a photomask (500 of FIG. 5) in accordance with some embodiments of the invention has relatively short vertical length, and thus it can be easily appreciated that it is possible to maintain the length from the lowermost to the uppermost of the contact hole within a limit range in a case of the photomask in accordance with some embodiments of the invention.

Figure 8:
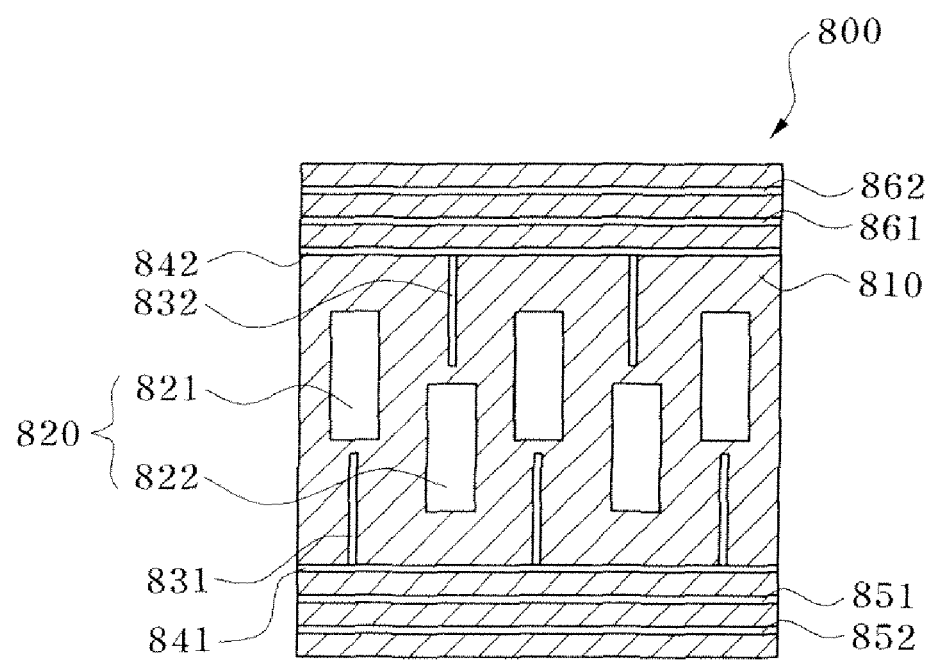
FIG. 8 is a plan view illustrating a photomask for forming a contact hole in a semiconductor device in accordance with another embodiment of the present invention.

FIG. 8 is a plan view illustrating a photomask for forming a contact hole in a semiconductor device in accordance with another embodiment of the invention. Referring to FIG. 8, a photomask in accordance with an embodiment of the invention has a structure in that a light shielding layer pattern 810 for defining a main pattern 820 and an auxiliary pattern 831, 832, 841, 842, 851, 854, 861, 862 are arranged on a light transmitting substrate (not shown). The light transmitting substrate is made of a quartz material. Alternatively, the light transmitting substrate can be made of another transparent material having a required light transmittance. The light shielding layer pattern 810 is made of a chromium (Cr) layer. If necessary, a phase shift layer pattern can be disposed instead of the light shielding layer pattern 810.

The main pattern 820 includes an upper main pattern 821 disposed in a relatively upper portion and a lower main pattern 822 disposed in a relatively lower portion. The upper main pattern 821 and the lower main pattern 822 are disposed alternately along a transverse direction and the main pattern 820 has thus a zigzag form. This main pattern 820 is a portion in which the light transmitting substrate is exposed by the light shielding layer pattern 810, and a region of the photoresist layer corresponding to this main pattern 820 is thus exposed upon exposure.

The auxiliary pattern 831, 832, 841, 842, 851, 852, 861, 862 includes a first auxiliary pattern 831, 832 extending in a vertical direction perpendicular to a direction, along which the main pattern 820 is arranged, i.e., a transverse direction, a second auxiliary pattern 841, 842 extending in the transverse direction, along which the main pattern 820 is arranged, and a third and fourth auxiliary patterns 851, 852, 861, 862 arranged parallel to the second auxiliary pattern 841, 842. The first auxiliary pattern 831, 832 includes a first lower auxiliary pattern 831 disposed adjacently to a lower portion of the upper main pattern 821 and a first upper auxiliary pattern 832 disposed adjacently to an upper portion of the lower main pattern 822. The second auxiliary pattern 841, 842 includes a second lower auxiliary pattern 841 which connects the first lower auxiliary patterns 831 with each other and a second upper auxiliary pattern 842 which connects the first upper auxiliary patterns 832 with each other. The third auxiliary pattern 851, 852 is arranged parallel to the second lower auxiliary pattern 841. The fourth auxiliary pattern 861, 862 is arranged parallel to the second upper auxiliary pattern 842. In the photomask 800 in accordance with another embodiment of the present invention, it is possible to enhance the vertical contrast more due to the presence of the third auxiliary pattern 851, 852 and the fourth auxiliary pattern 861, 862. Although two third auxiliary patterns 851, 852 and two fourth auxiliary patterns 861, 862 are illustrative, more third auxiliary patterns and fourth auxiliary patterns can be arranged, if necessary.

While the invention has been described with respect to the specific embodiments, various changes and modifications may be made without departing from the spirit and scope of the invention as defined in the following claims.

What is claimed is:

1. A photomask for forming contact holes arranged on a wafer in a zigzag form along a transverse direction, comprising:
    a light transmitting substrate;
    a main pattern disposed on the light transmitting substrate with a zigzag form as upper main patterns disposed in a relatively upper portion and lower main patterns disposed in a relatively lower portion are arranged alternately along a transverse direction;
    first lower auxiliary patterns, each extending in a vertical direction and disposed adjacently to a lower portion of each of the upper main patterns;
    first upper auxiliary patterns, each extending in a vertical direction and disposed adjacently to an upper portion of each of the lower main patterns;
    a second lower auxiliary pattern extending in the transverse direction connecting the first lower auxiliary patterns with each other; and
    a second upper auxiliary pattern extending in the transverse direction and connecting the first upper auxiliary patterns with each other.

2. The photomask of claim 1, further comprising: a light shielding layer pattern formed on a region of the light transmitting substrate on which the main pattern, the first lower auxiliary patterns, the first upper auxiliary patterns, the second lower auxiliary pattern and the second upper auxiliary pattern are not disposed.

3. The photomask of claim 1, further comprising: a phase shift layer pattern formed on a region of the light transmitting substrate on which the main pattern, the first lower auxiliary patterns, the first upper auxiliary patterns, the second lower auxiliary pattern and the second upper auxiliary pattern are not disposed.

4. The photomask of claim 1, wherein a critical dimension of each of the first lower auxiliary patterns and the first upper auxiliary patterns is smaller than a critical dimension of the main pattern.

5. The photomask of claim 1, further comprising the second lower auxiliary pattern connected to an end of each of the first lower auxiliary patterns that is opposite to an end adjacent to each or the upper main patterns, and the second upper auxiliary pattern connected to an end of each of the first upper auxiliary patterns that is opposite to an end adjacent to each of the lower main patterns.

6. The photomask of claim 1, further comprising: a third auxiliary pattern arranged parallel to the second lower auxiliary pattern.

7. The photomask of claim 6, further comprising: a fourth auxiliary pattern arranged parallel to the second upper auxiliary pattern.

* * * * *